United States Patent
Satani et al.

(10) Patent No.: US 8,405,438 B2
(45) Date of Patent: Mar. 26, 2013

(54) SEMICONDUCTOR CIRCUIT AND METHOD OF RETRIEVING SIGNAL TO SEMICONDUCTOR CIRCUIT

(75) Inventors: Norihiko Satani, Miyazaki (JP); Yuichi Matsushita, Miyazaki (JP); Takahiro Imayoshi, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 51 days.

(21) Appl. No.: 13/190,915

(22) Filed: Jul. 26, 2011

(65) Prior Publication Data

US 2012/0038403 A1  Feb. 16, 2012

(30) Foreign Application Priority Data

Aug. 12, 2010  (JP) .................................. 2010-180979

(51) Int. Cl.
*H03L 7/00* (2006.01)

(52) U.S. Cl. .............. 327/162; 327/58; 327/63; 327/65; 327/163

(58) Field of Classification Search .................... 327/58, 327/63, 65, 162, 163
See application file for complete search history.

(56) References Cited

U.S. PATENT DOCUMENTS 7,706,480 B2 * 4/2010 Stojanovic et al. ........... 375/340

FOREIGN PATENT DOCUMENTS

| JP | 2005-338727 A | 12/2005 |
| JP | 2009-111794 A | 5/2009 |

* cited by examiner

*Primary Examiner* — John Poos
(74) *Attorney, Agent, or Firm* — Kubotera & Associates, LLC (57) ABSTRACT

In a semiconductor circuit, a high frequency level detecting unit detects a level of a high frequency component adjusted with a first adjusting unit, and a first control unit controls a first gain of the adjusting unit according to the level of the high frequency component thus detected. Further, a low frequency level detecting unit detects a level of a low frequency component adjusted with a second adjusting unit. A second control unit controls a second gain according to the level of the high frequency component and the level of the low frequency component thus adjusted, so that a difference between the level of the high frequency component adjusted with the first adjusting unit and the level of the low frequency component adjusted with the second adjusting unit becomes smaller than a specific level determined in advance.

5 Claims, 7 Drawing Sheets

FIG. 7
PRIOR ART

SEMICONDUCTOR CIRCUIT AND METHOD OF RETRIEVING SIGNAL TO SEMICONDUCTOR CIRCUIT

BACKGROUND OF THE INVENTION AND RELATED ART STATEMENT

The present invention relates to a semiconductor circuit and a method of retrieving a signal to the semiconductor circuit. More specifically, the present invention relates to a semiconductor circuit as an input circuit capable of dealing with both a differential input method and a single input method, and a method of retrieving a signal to the semiconductor circuit.

In general, a liquid crystal display has been widely used. The liquid crystal display may be formed of a thin film transistor (a TFT) as a liquid crystal panel. Further, the liquid crystal display may be provided with a source driver as a drive circuit for displaying an image on the liquid crystal display. The source driver is configured as the drive circuit of the liquid crystal display for receiving a data signal and a control signal from a timing controller for displaying an image on the liquid crystal display, and to output the data signal and the control signal to a signal line of the liquid crystal display.

When the source driver outputs the data signal and the control signal, in order to prevent the liquid crystal display from being burned out, a polarity of an output terminal for outputting the data signal to the liquid crystal display is switched alternately. In other words, the output terminals with an even number are categorized as an EVEN, and the output terminals with an odd number are categorized as an ODD, so that each of the groups (the EVEN and the ODD) is controlled to output. In order to correspond to the output control, an input signal is categorized as the EVEN or the ODD.

The source driver is configured to receive the data signal and the control signal in the following two input methods, namely, a differential input method such as an RSDS input method and a single input method such as a COMS input method (refer to Patent Reference 1).

Patent Reference 1: Japanese Patent Publication No. 2005-338727

In the differential input method (the RSDS input method), an input circuit of a conventional source driver receives the data signal and the control signal in the following manner. The input circuit of the conventional source driver receives the EVEN signal at a timing when a clock (CLK) signal declines, and receives the ODD signal at a timing when the clock (CLK) signal rises.

In the differential input method, the conventional source driver has two types of input paths, that is a P terminal for receiving a P side input signal and an N terminal for receiving an N side input signal (for example, an inverted signal of the P side signal). Further, the conventional source driver is configured to determine an L level and an H level of the input signal according to a voltage difference between the P side input signal and the N side input signal. The P side input signal and the N side input signal tend to have a small amplitude, thereby making it possible to reduce a noise. On the other hand, it is necessary to provide the two input terminals (the P terminal and the N terminal) for receiving one single data.

Figure 7:
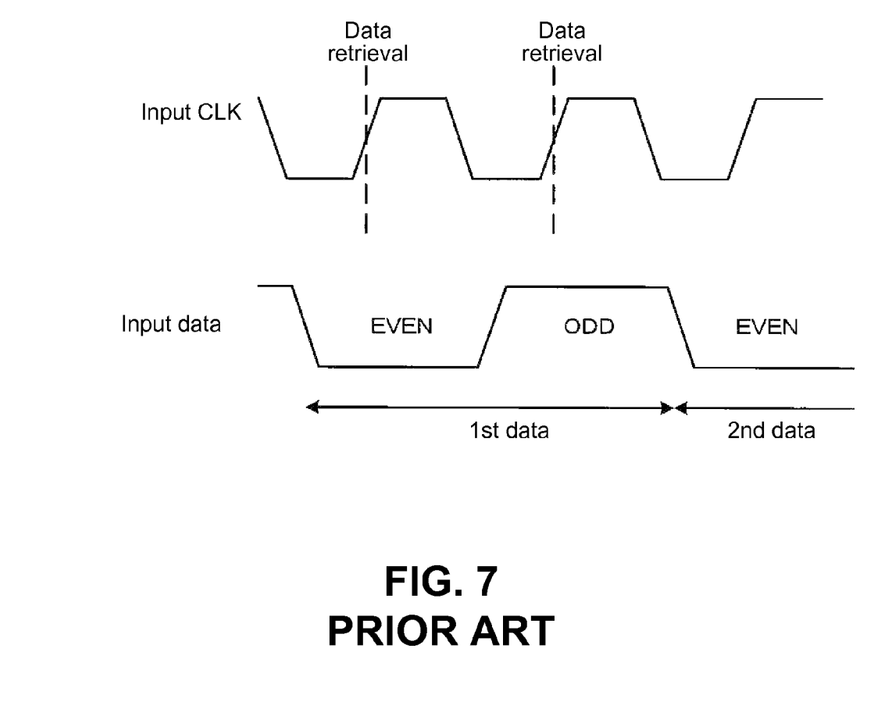
FIG. 7 is a time chart showing an example of a data retrieving operation of an input circuit of a conventional source driver.

In the single input method (the COMS input method), the conventional source driver receives the data signal and the control signal in a time chart shown in FIG. 7. FIG. 7 is the time chart showing an example of a data retrieving operation of the input circuit of the conventional source driver.

As shown in FIG. 7, in the single input method, the input circuit of the conventional source driver receives the EVEN signal at a first timing when the clock (CLK) signal rises, and receives the ODD signal at a next timing when the clock (CLK) signal rises.

In the single input method, the conventional source driver is configured to determine the L level and the H level of the input signal according to a voltage level of the input signal. Accordingly, it is necessary to provide only one input terminal for receiving one single data. On the other hand, the input signal tends to have a large amplitude, thereby increasing a noise as opposed to the differential input method.

In the conventional source driver, the differential input method or the single input method is selected according to an application. More specifically, it is necessary to design the input method of the conventional source driver according to the output method of the timing controller. The conventional source driver may be provided with the input circuit capable of adopting both input methods. In this case, the conventional source driver is configured to switch modes between the differential input method and the single input method, so that the conventional source driver is able to deal with both the differential input method and the single input method.

Patent Reference 2 has disclosed the conventional source driver having an input circuit capable of adopting the differential input method and the single input method.

Patent Reference 2: Japanese Patent Publication No. 2009-111794

In the input circuit of the conventional source driver, as explained above, it is necessary to provide two input terminals for inputting one single data in the differential input method, and to provide just one input terminal for inputting one single data in the single input method. The input circuit is configured to be capable of adopting both input methods through the following two configurations.

In the first configuration, the input circuit is provided with a differential input terminal provided for inputting the input signal in the differential input method, and is separately provided with a single input terminal for inputting the input signal in the single input method. In the second configuration, the input circuit is provided with a common input terminal provided for inputting the input signal in the differential input method and the single input method.

In the first configuration, it is necessary to provide a large number of input terminals, thereby increasing a chip size. In the second configuration, the input circuit has unused input terminals. Accordingly, it is necessary to design a specific configuration for the unused input terminals (for example, it is necessary to dispose an extra wiring portion on a substrate, or to fix the unused input terminals in a device). As a result, it is necessary to change a wiring pattern on the substrate depending on the input method. Further, when the input terminal is fixed, the P side input terminal has a load different from that of the N side input terminal, thereby causing a large influence on a characteristic of the conventional source driver in the differential input method.

In view of the problems described above, an object of the present invention is to provide a semiconductor circuit and a method of retrieving a signal to the semiconductor circuit capable of solving the problems of the conventional semiconductor circuit. In the present invention, it is possible to properly input an input signal input through a different input method according to the input method.

Further objects and advantages of the invention will be apparent from the following description of the invention.

SUMMARY OF THE INVENTION

In order to attain the objects described above, according to a first aspect of the present invention, a semiconductor circuit includes a first terminal; a second terminal; a single input circuit; a differential amplifier; and a differential input circuit.

According to the first aspect of the present invention, in the semiconductor circuit, the first terminal is provided for inputting a first differential signal when an input method is a differential input method and inputting a first signal for output when the input method is a single input method. The second terminal is provided for inputting a second differential signal different from the first differential signal when the input method is the differential input method, and for inputting a second signal for output when the input method is the single input method.

According to the first aspect of the present invention, in the semiconductor circuit, the single input circuit is provided for retrieving the first signal for output input into the first terminal at a timing according to a clock signal indicating a signal retrieving timing when the input method is the single input method according to a method signal indicating whether the input method is the differential input method or the single input method, and for outputting the first signal for output as a first output signal. The single input circuit is provided further for retrieving the second signal for output input into the second terminal at the timing according to the clock signal, and for outputting the second signal for output as a second output signal.

According to the first aspect of the present invention, in the semiconductor circuit, the differential amplifier is provided for outputting a differential voltage signal according to a difference between the first differential signal input into the first terminal and the second differential signal input into the second terminal when the input method is the differential input method.

According to the first aspect of the present invention, in the semiconductor circuit, the differential input circuit is provided for retrieving the differential voltage signal output from the differential amplifier at a first timing according to the clock signal, and for outputting the differential voltage signal as a first output signal. The differential input circuit is provided further for retrieving the differential voltage signal at a second timing different from the first timing according to the clock signal, and for outputting the differential voltage signal as a second output signal.

According to a second aspect of the present invention, in the semiconductor circuit in the first aspect of the present invention, the single input circuit is provided for retrieving the first signal for output input into the first terminal at a timing according to a rise of the clock signal, and for outputting the first signal for output as the first output signal. Further, the single input circuit is provided for retrieving the second signal for output input into the second terminal at the timing according to the rise of the clock signal, and for outputting the second signal for output as the second output signal.

According to a third aspect of the present invention, in the semiconductor circuit in the first aspect or the second aspect of the present invention, the differential input circuit is provided for retrieving the differential voltage signal at the first timing according to the rise of the clock signal, and for outputting the differential voltage signal as the second output signal. Further, the differential input circuit is provided further for retrieving the differential voltage signal at the second timing according to a decline of the clock signal, and for outputting the differential voltage signal as the first output signal.

According to a fourth aspect of the present invention, the semiconductor circuit in one of the first aspect to the third aspect of the present invention further includes a selection circuit for selecting one of the first output signal and the second output signal output from the differential input circuit according to the method signal when the input method is the differential input method. The selection circuit is provided for selecting one of the first output signal and the second output signal output from the single input circuit according to the method signal when the input method is the single input method.

According to a fifth aspect of the present invention, a method of retrieving a signal to a semiconductor circuit includes the steps of: inputting a first signal for output into a first terminal when an input method is a single input method; inputting a second signal for output into a second terminal when the input method is the single input method; retrieving the first signal for output input into the first terminal with a single input circuit at a timing according to a clock signal indicating a signal retrieving timing when the input method is the single input method; outputting the first signal for output as a first output signal with the single input circuit when the input method is the single input method; retrieving the second signal for output input into the second terminal with the single input circuit at the timing according to the clock signal when the input method is the single input method; and outputting the second signal for output as a second output signal with the single input circuit when the input method is the single input method.

Further, according to the fifth aspect of the present invention, the method of retrieving the signal to the semiconductor circuit includes the steps of: inputting a first differential signal into the first terminal when the input method is a differential input method; inputting a second differential signal different from the first differential signal into the second terminal when the input method is the differential input method; outputting a differential voltage signal with a differential amplifier according to a difference between the first differential signal input into the first terminal and the second differential signal input into the second terminal when the input method is the differential input method; retrieving the differential voltage signal output from the differential amplifier with a differential input circuit at a first timing according to the clock signal when the input method is the differential input method; outputting the differential voltage signal as a first output signal with the differential input circuit at the first timing when the input method is the differential input method; retrieving the differential voltage signal with the differential input circuit at a second timing different from the first timing according to the clock signal when the input method is the differential input method; and outputting the differential voltage signal as a second output signal with the differential input circuit at the second timing when the input method is the differential input method.

As described above, in the present invention, it is possible to properly retrieve the signal input in the different input methods according to the input method.

DETAILED DESCRIPTION OF PREFERRED EMBODIMENTS

Hereunder, preferred embodiments of the present invention will be explained with reference to the accompanying drawings. In the following description, as an embodiment of the present invention, a semiconductor circuit or an input circuit for retrieving an input signal into a source driver of a liquid crystal display will be explained in detail.

Figure 1:
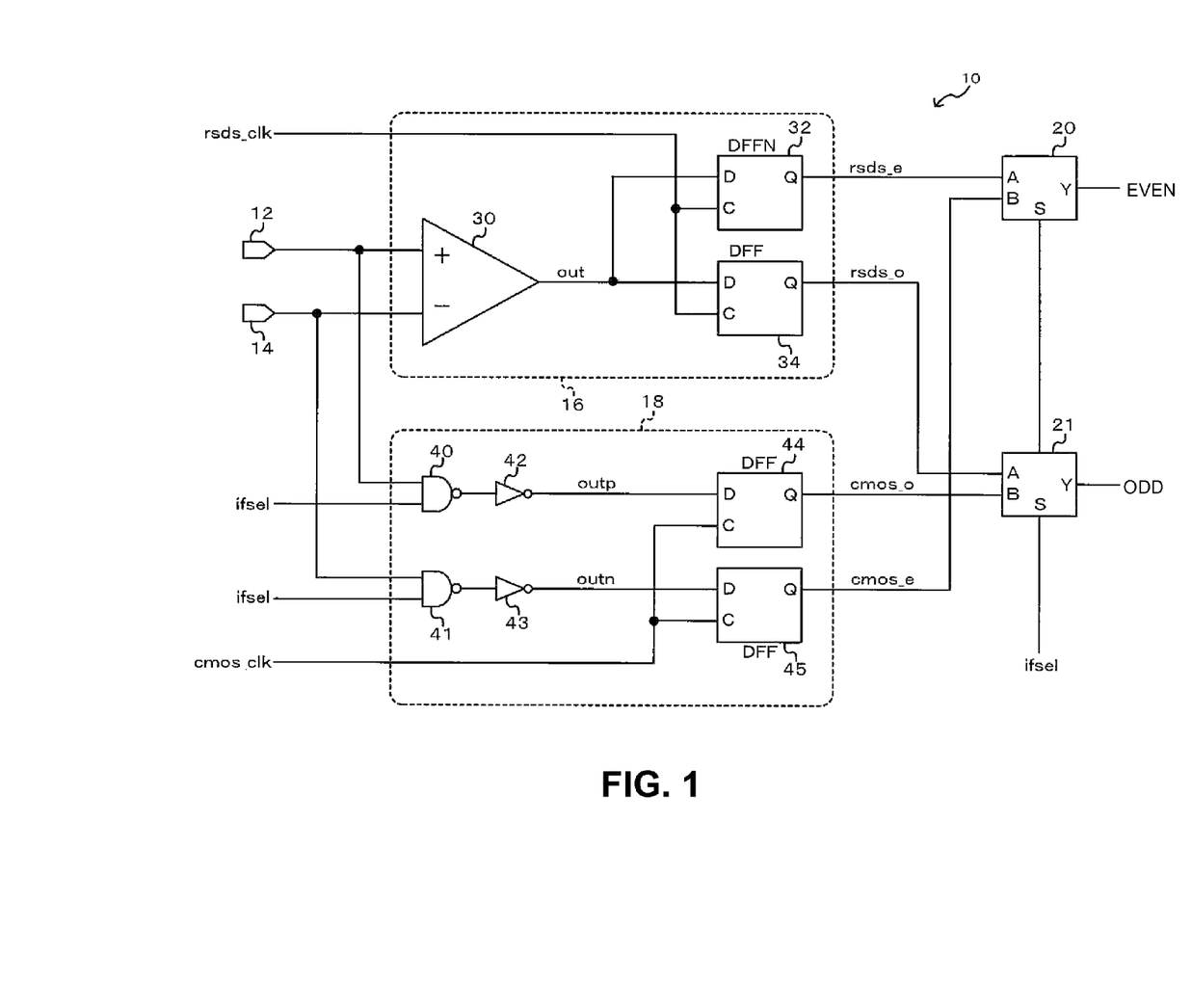
FIG. 1 is a block diagram showing a configuration of an input circuit according to an embodiment of the present invention.
Figure 2:
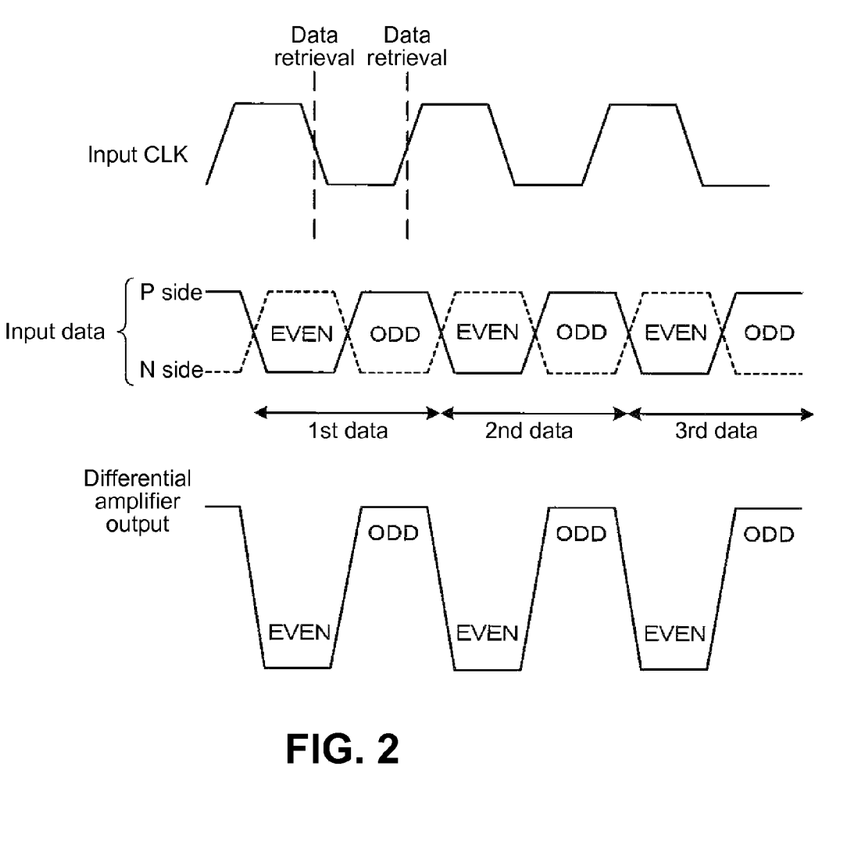
FIG. 2 is a time chart showing a data retrieving operation of the input circuit in a differential input method according to the embodiment of the present invention.
Figure 3:
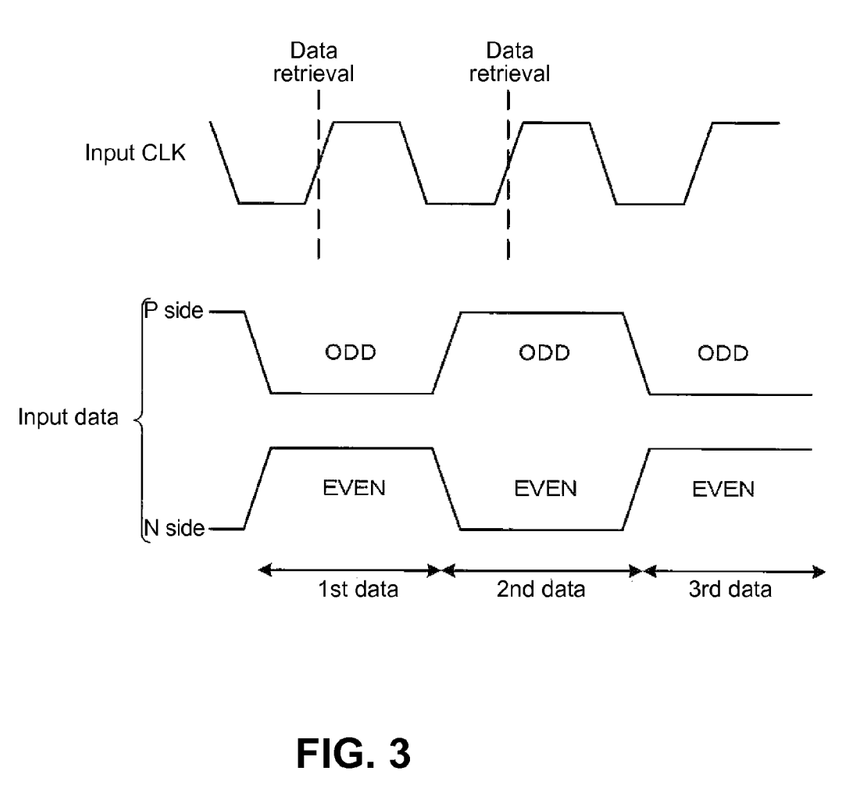
FIG. 3 is a time chart showing the data retrieving operation of the input circuit in a single input method according to the embodiment of the present invention.

FIG. 1 is a block diagram showing a configuration of an input circuit 10 according to an embodiment of the present invention. FIG. 2 is a time chart showing a data retrieving operation of the input circuit 10 in a differential input method according to the embodiment of the present invention. FIG. 3 is a time chart showing the data retrieving operation of the input circuit 10 in a single input method according to the embodiment of the present invention.

As shown in FIG. 1, the input circuit 10 includes a P side input terminal 12; an N side input terminal 14; a differential input circuit 16; a single input circuit 18; and selectors 20 and 21. The input circuit 10 is provided for receiving a data signal and control signals (rsds_clk, cmos_clk, ifsel) from a timing controller (not shown).

In the embodiment, the control signals rsds_clk and cmos_clk are clock signals for defining timings to retrieve data into the differential input circuit 16 and the single input circuit 18. The control signal ifsel is a method signal indicating whether an input method is a differential input method or a single input method. When the control signal ifsel is at an "L" level, the control signal ifsel indicates the differential input method. When the control signal ifsel is at an "H" level, the control signal ifsel indicates the single input method.

In the embodiment, the input circuit 10 has a function of retrieving EVEN data from a data signal input from the timing controller so that the EVEN data are applied to an EVEN (an even number) terminal of the liquid crystal display (not shown), and of retrieving ODD data from the data signal so that the ODD data are applied to an ODD (an odd number) terminal of the liquid crystal display (not shown). The input circuit 10 is also provided for outputting the EVEN data and the ODD data to a later stage circuit of the source driver.

As shown in FIG. 2, in the differential input method, a differential signal is input into the P side input terminal 12 from the timing controller. As shown in FIG. 3, in the single input method, a data signal is input into the P side input terminal 12 from the timing controller for retrieving the ODD data.

As shown in FIG. 2, in the differential input method, a differential signal is input into the N side input terminal 14 from the timing controller. As shown in FIG. 3, in the single input method, a data signal is input into the N side input terminal 14 from the timing controller for retrieving the EVEN data.

In the embodiment, the differential input circuit 16 is an interface for dealing with the differential input method. In the differential input method, the differential input circuit 16 has a function of retrieving the ODD data and the EVEN data from the data signal.

In the embodiment, the differential input circuit 16 includes a differential amplifier 30, a DFFN 32, and a DFF 34. The differential amplifier 30 has a function of generating a differential voltage signal out (a differential amplifier output out shown in FIG. 2) from the data signal input into the P side input terminal 12 (refer to a P side of the input data shown in FIG. 2) and the data signal input into the N side input terminal 14 (refer to an N side of the input data shown in FIG. 2), and for outputting the differential voltage signal out.

In the embodiment, the DFFN 32 has a function of retrieving the EVEN data at a timing of a rise of the clock signal from the differential amplifier output out output from the differential amplifier 30 according to the clock signal (rsds_clk, refer to an input CLK shown in FIG. 2). Further, the DFFN 32 has a function of outputting the EVEN data thus retrieved to the selector 20.

Figure 4:
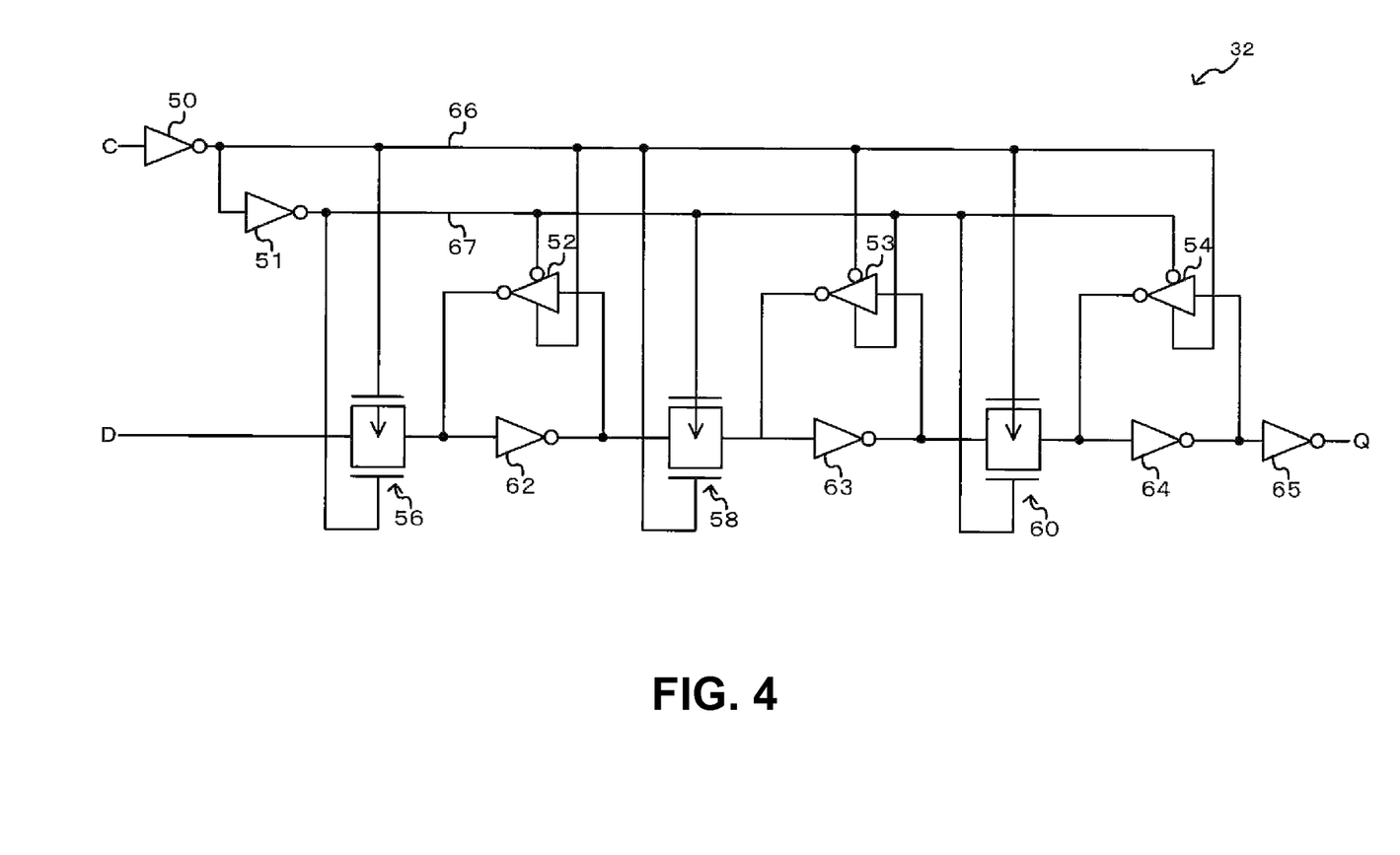
FIG. 4 is a circuit diagram showing an example of a DFFN of a differential input circuit of the input circuit according to the embodiment of the present invention.

FIG. 4 is a circuit diagram showing an example of the DFFN 32 of the differential input circuit 16 of the input circuit 10 according to the embodiment of the present invention. As shown in FIG. 4, the DFFN 32 is a flip-flop circuit, and includes inverters 50, 51, 52, 53, 54, 62, 63, 64, and 65 and MOS transistors 56, 58, and 60 each being formed of a pair of a PMOS and an NMOS.

In the embodiment, a gate of the PMOS of the MOS transistor 56 is connected to a signal line 66 for outputting an inverted signal with the level of the clock signal inverted with the inverter 50. Further, a gate of the NMOS of the MOS transistor 56 is connected to a signal line 67 for outputting an inverted signal with the level of the clock signal inverted with the inverter 50 and further inverted with the inverter 51, that is, a signal having a level the same as that of the clock signal. A gate of the PMOS of the MOS transistor 58 is connected to the signal line 67, and a gate of the NMOS of the MOS transistor 58 is connected to the signal line 66. A gate of the PMOS of the MOS transistor 60 is connected to the signal line 66, and a gate of the NMOS of the MOS transistor 60 is connected to the signal line 67.

In the embodiment, an input of the inverter 52 is connected to an output of the inverter 62, and an output of the inverter 52 is connected to an input of the inverter 62. The inverter 52 is connected to the signal lines 66 and 67, so that an inverted signal of a signal flowing through the signal line 66 and an inverted signal of a signal flowing through the signal line 67 control a drive of the inverter 52.

In the embodiment, an input of the inverter 53 is connected to an output of the inverter 63, and an output of the inverter 53 is connected to an input of the inverter 63. The inverter 53 is connected to the signal lines 66 and 67, so that an inverted signal of the signal flowing through the signal line 66 and an inverted signal of the signal flowing through the signal line 67 control a drive of the inverter 53.

In the embodiment, an input of the inverter 54 is connected to an output of the inverter 64, and an output of the inverter 54 is connected to an input of the inverter 64. The inverter 54 is connected to the signal lines 66 and 67, so that an inverted signal of the signal flowing through the signal line 66 and an inverted signal of the signal flowing through the signal line 67 control a drive of the inverter 54.

In the embodiment, the DFF 32 has a function of retrieving the ODD data at a timing of the rise of the clock signal from the differential amplifier output out output from the differential amplifier 30 according to the clock signal (rsds_clk, refer to the input CLK shown in FIG. 2). Further, the DFF 32 has a function of outputting the ODD data thus retrieved to the selector 20.

Figure 5:
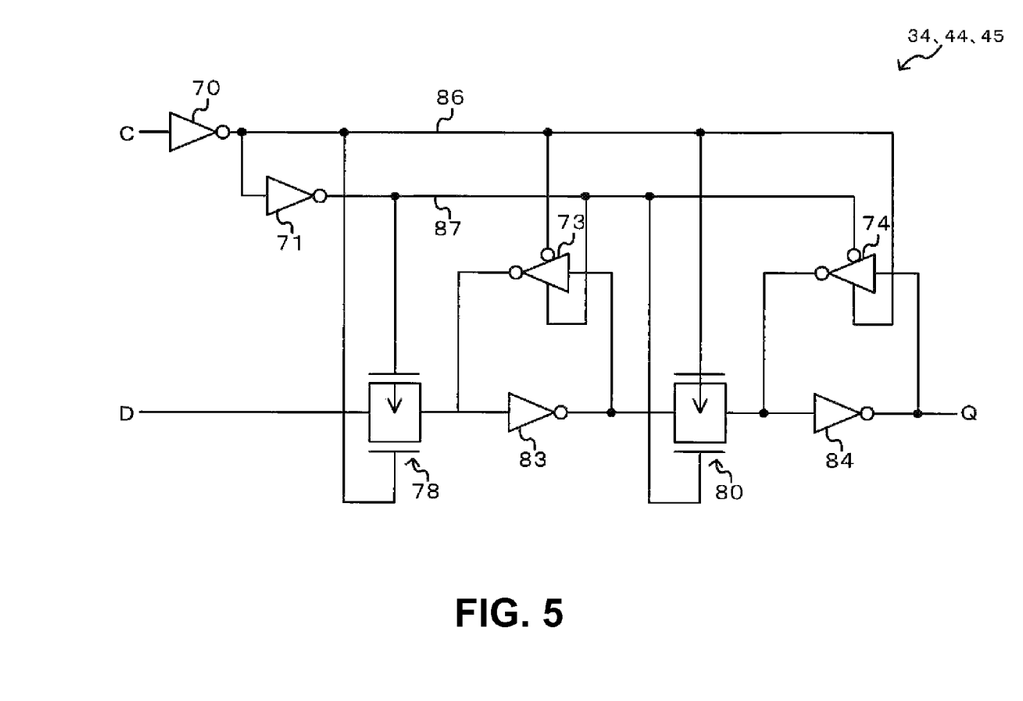
FIG. 5 is a circuit diagram showing an example of a DFF of the differential input circuit and a single input circuit of the input circuit according to the embodiment of the present invention.

FIG. 5 is a circuit diagram showing an example of the DFF 34 of the differential input circuit 16 of the input circuit 10 according to the embodiment of the present invention. As shown in FIG. 5, the DFF 32 is a flip-flop circuit, and includes inverters 70, 71, 72, 73, 83, 84, and 85 and MOS transistors 76 and 78 each being formed of a pair of a PMOS and an NMOS.

In the embodiment, a gate of the NMOS of the MOS transistor 78 is connected to a signal line 86 for outputting an inverted signal with the level of the clock signal inverted with the inverter 70. Further, a gate of the PMOS of the MOS transistor 78 is connected to a signal line 87 for outputting an inverted signal with the level of the clock signal inverted with the inverter 70 and further inverted with the inverter 71, that is, a signal having a level the same as that of the clock signal. A gate of the NMOS of the MOS transistor 80 is connected to the signal line 87, and a gate of the PMOS of the MOS transistor 80 is connected to the signal line 86.

In the embodiment, an input of the inverter 73 is connected to an output of the inverter 83, and an output of the inverter 73 is connected to an input of the inverter 83. The inverter 83 is connected to the signal lines 86 and 87, so that an inverted signal of a signal flowing through the signal line 86 and an inverted signal of a signal flowing through the signal line 87 control a drive of the inverter 83.

In the embodiment, an input of the inverter 74 is connected to an output of the inverter 84, and an output of the inverter 74 is connected to an input of the inverter 84. The inverter 74 is connected to the signal lines 86 and 87, so that an inverted signal of the signal flowing through the signal line 86 and an inverted signal of the signal flowing through the signal line 87 control a drive of the inverter 74.

An operation of the differential input circuit 16 for retrieving the data signal in the differential input method will be explained with reference to FIGS. 2, 4 and 5.

In the embodiment, in the DFFN 32, when the clock signal is the H level, the signal flowing through the signal line 66 is the L level and the signal flowing through the signal line 67 is the H level. Accordingly, the MOS transistors 56 and 60 are turned on, and the MOS transistor 58 is turned off. Further, the drive of the inverters 52 and 54 is restricted, and the inverter 53 is driven.

On the other hand, when the clock signal is the L level, the signal flowing through the signal line 66 is the H level and the signal flowing through the signal line 67 is the L level. Accordingly, the MOS transistors 56 and 60 are turned off, and the MOS transistor 58 is turned on. Further, the inverters 52 and 54 are driven, and the drive of the inverter 53 is restricted. Accordingly, when the clock signal declines from the H level to the L level, the DFFN 32 retrieves the data signal.

In the embodiment, in the DFF 32, when the clock signal is the L level, the signal flowing through the signal line 86 is the H level and the signal flowing through the signal line 87 is the L level. Accordingly, the MOS transistor 78 is turned on, and the MOS transistor 80 is turned off. Further, the drive of the inverter 73 is restricted, and the inverter 74 is driven.

On the other hand, when the clock signal is the H level, the signal flowing through the signal line 86 is the L level and the signal flowing through the signal line 87 is the H level. Accordingly, the MOS transistor 78 is turned off, and the MOS transistor 80 is turned on. Further, the inverter 73 is driven, and the drive of the inverter 74 is restricted. Accordingly, when the clock signal rises from the L level to the H level, the DFF 32 retrieves the data signal.

As explained above, as shown in FIG. 2, in the embodiment, when the clock signal declines, the EVEN data are retrieved from the differential amplifier output out. Further, when the clock signal rises, the ODD data are retrieved from the differential amplifier output out. It is noted that during one cycle of the clock signal, the ODD data, the EVEN data, and a pair of ODD and EVEN data (refer to 1st data shown in FIG. 2) are retrieved.

In the embodiment, the single input circuit 18 is an interface for dealing with the single input method. In the single input method, the single input circuit 18 has a function of retrieving the ODD data from the data signal for retrieving the ODD data, and retrieving the EVEN data from the data signal for retrieving the EVEN data.

In the embodiment, the single input circuit 18 includes NAND circuits 40 and 41, inverters 42 and 43, and DFFs 44 and 45. The NAND circuit 44 receives the data signal for retrieving the ODD data input into the P side input terminal 12 and the control signal ifsel. Accordingly, in the single input method, that is, when the control signal ifsel is the H level, the NAND circuit 40 outputs an inverted signal of the data signal thus input. The inverter 42 inverts the inverted signal, so that the DFF 44 receives a signal outp with the level the same as the data signal input into the P side input terminal 12.

Similarly, the NAND circuit 41 receives the data signal for retrieving the EVEN data input into the N side input terminal 14 and the control signal ifsel. Accordingly, in the single input method, that is, when the control signal ifsel is the H level, the NAND circuit 40 outputs an inverted signal of the data signal thus input. The inverter 43 inverts the inverted signal, so that the DFF 45 receives a signal outn with the level the same as the data signal input into the N side input terminal 14.

In the embodiment, in the differential input method, that is, when the control signal ifsel is the L level, regardless of the level of the data signal thus input, the NAND circuits 40 and 41 output a signal with the H level. Accordingly, regardless of the level of the data signal thus input, the signals outp and outn both become signals with the L level.

In the embodiment, the DFF 44 has a function of retrieving the ODD data at the timing of the rise of the clock signal from the signal outp according to a clock signal (cmos_clk, refer to an input CLK shown in FIG. 3). Further, the DFF 44 has a function of outputting the ODD data thus retrieved to the selector 21. Similarly, the DFF 45 has a function of retrieving the EVEN data at the timing of the rise of the clock signal from the signal outn according to the clock signal (cmos_clk, refer to the input CLK shown in FIG. 3). Further, the DFF 45 has a function of outputting the EVEN data thus retrieved to the selector 20.

In the embodiment, the DFFs 44 and 45 are formed of a flip-flop circuit having an identical configuration, and has a configuration the same as that of the DFF 34 of the differential input circuit 16 (refer to FIG. 5). The configuration of the DFFs 44 and 45 is not limited to that in the embodiment, and the DFFs 44 and 45 may have a configuration different from that of the DFF 34.

An operation of the single input circuit 18 for retrieving the data signal in the single input method will be explained with reference to FIGS. 3 and 5.

In the embodiment, in the DFFs 44 and 45, when the clock signal is the L level, the signal flowing through the signal line 86 is the H level and the signal flowing through the signal line 87 is the L level. Accordingly, the MOS transistor 78 is turned on, and the MOS transistor 80 is turned off. Further, the drive of the inverter 73 is restricted, and the inverter 74 is driven.

On the other hand, when the clock signal is the H level, the signal flowing through the signal line 86 is the L level and the signal flowing through the signal line 87 is the H level. Accordingly, the MOS transistor 78 is turned off, and the MOS transistor 80 is turned on. Further, the drive of the inverter 74 is restricted, and the inverter 73 is driven. Accordingly, when the clock signal rises from the L level to the H level, the DFFs 44 and 45 retrieve the data signal.

As explained above, in the embodiment, when the clock signal rises, the DFF 44 retrieves the ODD data are from the data signal input from the P side input terminal 12. Further, when the clock signal rises, the DFF 45 retrieves the EVEN data are from the data signal input from the N side input terminal 14. In other words, in the single input circuit 18, both the ODD data and the EVEN data re retrieved at the identical timing. It is noted that every time when the clock signal rises, the ODD data, the EVEN data, and a pair of ODD and EVEN data (refer to 1st data shown in FIG. 3) are retrieved.

In the input circuit of the conventional source driver, as shown in the time chart in FIG. 7, a pair of data is retrieved at the two timings when the clock signal rises, similar to the differential input method. On the other hand, in the single input circuit 18 in the embodiment, it is possible to retrieve a pair of data every time when the clock signal rises. Accordingly, as opposed to the input circuit of the conventional source driver, it is possible to reduce the retrieving time of the data signal, for example, about twice as faster than the conventional source driver.

In the embodiment, the input circuit 10 further includes the selector 20 and the selector 21 as explained above. The selector 20 is provided for selecting the output of the differential input circuit 16 in the differential input method and the output of the single input circuit 18 in the single input method according to the control signal ifsel, and for outputting the output of the differential input circuit 16 or the output of the single input circuit 18 as the EVEN data. The selector 21 is provided for selecting the output of the differential input circuit 16 in the differential input method and the output of the single input circuit 18 in the single input method according to the control signal ifsel, and for outputting the output of the differential input circuit 16 or the output of the single input circuit 18 as the ODD data.

Figure 6:
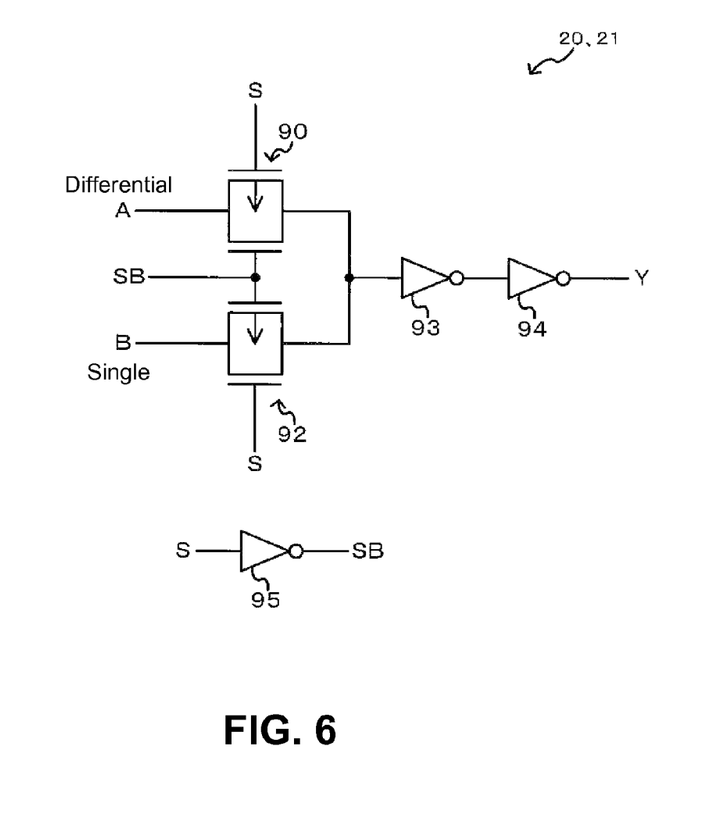
FIG. 6 is a circuit diagram showing an example of a selector of the input circuit according to the embodiment of the present invention.

FIG. 6 is a circuit diagram showing an example of the selectors 20 and 21 of the input circuit 10 according to the embodiment of the present invention. In the embodiment, the selector 20 and the selector 21 have an identical configuration formed of MOS transistors 90 and 92 and inverters 93, 94, and 95. Each of MOS transistors 90 and 92 is formed of a pair of PMOS and NMOS. It is configured such that the control signal ifsel is applied to a gate of the PMOS of the MOS transistor 90 and a gate of the NMOS of the MOS transistor 92. The inverter 85 inverts the control signal ifsel, and the inverted signal is applied to a gate of the NMOS of the MOS transistor 90 and a gate of the PMOS of the MOS transistor 92.

In the embodiment, in the differential input method, that is, when the control signal ifsel is at the L level, the MOS transistor 90 is turned on, and the MOS transistor 92 is turned off. Accordingly, the output of the differential input circuit 16 is selected and output through the inverters 93 and 94. On the other hand, in the single input method, that is, when the control signal ifsel is at the H level, the MOS transistor 90 is turned off, and the MOS transistor 92 is turned on. Accordingly, the output of the single input circuit 18 is selected and output through the inverters 93 and 94.

As explained above, in the embodiment, the input circuit 10 includes the P side input terminal 12, the N side input terminal 14, the differential input circuit 16, the single input circuit 18, and the selector 20. In the differential input method, that is, when the control signal ifsel is at the L level, the data signal input into the P side input terminal 12 is input into the non-inversion terminal of the differential input circuit 16, and the data signal input into the N side input terminal 14 is input into the inversion terminal of the differential input circuit 16. Further, the DFFN 32 retrieves the EVEN data from the output signal out of the differential amplifier 30 at the timing of the decline of the clock signal rsds_clk. Further, the DFF 32 retrieves the ODD data from the output signal out of the differential amplifier 30 at the timing of the rise of the clock signal rsds_clk.

On the other hand, in the single input method, that is, when the control signal ifsel is at the H level, the data signal input into the P side input terminal 12 for retrieving the ODD data is input into the NAND circuit 40 of the single input circuit 18, and the data signal input into the N side input terminal 14 for retrieving the ODD data is input into the NAND circuit 41 of the single input circuit 18. Further, the DFF 44 retrieves the ODD data from the data signal, and the DFF 45 retrieves the EVEN data from the data signal.

As described above, in the input circuit 10 in the embodiment, the P side input terminal 12 and the N side input terminal 14 are used both in the differential input method and the single input method. In other words, the same input terminals are used regardless of the input method. Accordingly, when a user uses the source driver provided with the input circuit 10, the user can use a common circuit board both in the differential input method and the single input method.

Further, when the conventional source driver is designed, it is necessary to provide input terminals separately for the differential input method and the single input method. Accordingly, it is difficult to dispose the differential input circuit 16 and the single input circuit 18 close to each other. On the other hand, when the source driver provided with the input circuit 10 in the embodiment is designed, it is possible to provide the common input terminals, and to dispose the differential input circuit 16 and the single input circuit 18 close to each other. As a result, it is possible to match a wiring load inside the device, and to easily adjust the timing.

Further, when the common input terminals are provided for the differential input method and the single input method, it is possible to reduce a size of a chip, as opposed to the case in which the input terminals are provided separately for the differential input method and the single input method.

Further, in the conventional source driver, in the single input method, the data signal is input into one of the two input terminals both used in the differential input method. On the other hand, in the input circuit 10 in the embodiment, the data signal is input both the P side input terminal 12 and the N side input terminal 14. Accordingly, there is no input terminal not utilized in the single input method. As a result, it is not necessary to design a specific configuration for the unused input terminals (for example, it is necessary to dispose an extra wiring portion on a substrate, or to fix the unused input terminals in a device), thereby reducing a size of a chip. Further, in the input circuit 10, the P side input terminal 12 has a load the same as that of the N side input terminal 14, thereby making it easy to adjust in the differential input method.

Further, in the embodiment, in the single input method, the ODD data and the EVEN data are retrieved at the same timing. Accordingly, as compared with the conventional source driver, it is possible to retrieve the ODD data and the EVEN data in a shorter period of time.

In the embodiment, the configuration of the differential input circuit 16 and the configuration of the single input circuit 18, especially the configuration of the DFFN 32, the DFF 32, the DFF 44, and the DFF 45, are just examples, and not limited to those explained above.

In the embodiment, the data are retrieved at the specific timing, and not limited thereto. For example, in the embodiment, the ODD data are retrieved at the timing of the rise of the clock signal and the EVEN data are retrieved at the timing of the decline of the clock signal in the differential input method. It may be configured such that the ODD data are retrieved at the timing of the decline of the clock signal and the EVEN data are retrieved at the timing of the rise of the clock signal in the differential input method.

Further, in the embodiment, the ODD data and the EVEN data are retrieved at the timing of the rise of the clock signal in the single input method. It may be configured such that the ODD data and the EVEN data are retrieved at the timing of the decline of the clock signal in the single input method.

The disclosure of Japanese Patent Application No. 2010-180979, filed on Aug. 12, 2010, is incorporated in the application by reference.

While the invention has been explained with reference to the specific embodiments of the invention, the explanation is illustrative and the invention is limited only by the appended claims.

What is claimed is:

1. A semiconductor circuit, comprising:
a first terminal for inputting a first differential signal when an input method is a differential input method, and for inputting a first signal for output when the input method is a single input method;
a second terminal for inputting a second differential signal different from the first differential signal when the input method is the differential input method, and for inputting a second signal for output when the input method is the single input method;
a single input circuit for retrieving the first signal for output at a timing according to a clock signal when the input method is the single input method according to a method signal indicating whether the input method is the differential input method or the single input method, and for outputting the first signal for output as a first output signal, said single input circuit being arranged to retrieve the second signal for output at the timing according to the clock signal, and to output the second signal for output as a second output signal;
a differential amplifier for outputting a differential voltage signal according to a difference between the first differential signal and the second differential signal when the input method is the differential input method; and
a differential input circuit for retrieving the differential voltage signal at a first timing according to the clock signal, and for outputting the differential voltage signal as a first output signal, said differential input circuit being arranged to retrieve the differential voltage signal at a second timing different from the first timing according to the clock signal, and to output the differential voltage signal as a second output signal.

2. The semiconductor circuit according to claim 1, wherein said single input circuit is arranged to retrieve the first signal for output at the timing according to a rise of the clock signal, and to retrieve the second signal for output at the timing according to the rise of the clock signal.

3. The semiconductor circuit according to claim 1, wherein said differential input circuit is arranged to retrieve the differential voltage signal at the first timing according to the rise of the clock signal, and to retrieve the differential voltage signal at the second timing according to a decline of the clock signal.

4. The semiconductor circuit according to claim 1, further comprising a selection circuit for selecting one of the first output signal and the second output signal output from the differential input circuit according to the method signal when the input method is the differential input method, and for selecting one of the first output signal and the second output signal output from the single input circuit according to the method signal when the input method is the single input method.

5. A method of retrieving a signal to a semiconductor circuit, comprising the steps of:
inputting a first signal for output into a first terminal when an input method is a single input method;
inputting a second signal for output into a second terminal when the input method is the single input method;
retrieving the first signal for output with a single input circuit at a timing according to a clock signal when the input method is the single input method;
outputting the first signal for output as a first output signal with the single input circuit when the input method is the single input method;
retrieving the second signal for output with the single input circuit at the timing according to the clock signal when the input method is the single input method;
outputting the second signal for output as a second output signal with the single input circuit when the input method is the single input method;
inputting a first differential signal into the first terminal when the input method is a differential input method;
inputting a second differential signal different from the first differential signal into the second terminal when the input method is the differential input method;
outputting a differential voltage signal with a differential amplifier according to a difference between the first differential signal and the second differential signal when the input method is the differential input method;
retrieving the differential voltage signal with a differential input circuit at a first timing according to the clock signal when the input method is the differential input method;
outputting the differential voltage signal as a first output signal with the differential input circuit at the first timing when the input method is the differential input method;
retrieving the differential voltage signal with the differential input circuit at a second timing different from the first timing according to the clock signal when the input method is the differential input method; and
outputting the differential voltage signal as a second output signal with the differential input circuit at the second timing when the input method is the differential input method.

* * * * *